United States Patent
Chiu et al.

(10) Patent No.: US 11,302,631 B2
(45) Date of Patent: Apr. 12, 2022

(54) INTEGRATED CIRCUIT CELLS AND RELATED METHODS

(71) Applicant: TAIWAN SEMICONDUCTOR MANUFACTURING COMPANY LTD., Hsinchu (TW)

(72) Inventors: Te-Hsin Chiu, Miaoli County (TW); Shih-Wei Peng, Hsinchu (TW); Jiann-Tyng Tzeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 69 days.

(21) Appl. No.: 16/943,896

(22) Filed: Jul. 30, 2020

(65) Prior Publication Data
US 2022/0037252 A1    Feb. 3, 2022

(51) Int. Cl.
*H01L 23/522* (2006.01)
*H01L 27/02* (2006.01)
*H01L 27/118* (2006.01)
*H01L 21/768* (2006.01)

(52) U.S. Cl.
CPC .... *H01L 23/5226* (2013.01); *H01L 21/76802* (2013.01); *H01L 21/76877* (2013.01); *H01L 27/0207* (2013.01); *H01L 27/11807* (2013.01); *H01L 2027/11861* (2013.01); *H01L 2027/11887* (2013.01)

(58) Field of Classification Search
CPC .......... H01L 23/5226; H01L 21/76802; H01L 21/76877; H01L 27/0207; H01L 27/11807; H01L 2027/11861; H01L 2027/11887
See application file for complete search history.

(56) References Cited

U.S. PATENT DOCUMENTS

| 10,020,255 B1* | 7/2018 | Bao .................... H01L 21/76879 |
| 2020/0027780 A1* | 1/2020 | Briggs ................ H01L 23/5226 |

* cited by examiner

*Primary Examiner* — Karen Kusumakar
(74) *Attorney, Agent, or Firm* — WPAT, P.C., Intellectual Property Attorneys; Anthony King

(57) ABSTRACT

An integrated circuit cell is provided, which may include a substrate with a front side and a back side, an active region, a first via, and first, second and third conductive layers. A portion of the active region may be formed within the substrate. The first via and the first, second and third conductive layers are on the back side. The second and third conductive layers may be located further away from the substrate in a first direction than the first and second conductive layers, respectively. The depth of the first via may be greater than a distance between the second conductive layer and the third conductive layer. The integrated circuit cell may include a cell height in a second direction substantially perpendicular to the first direction. A width of the first via along the second direction may be between about 0.05 to about 0.25 times the cell height.

20 Claims, 22 Drawing Sheets

INTEGRATED CIRCUIT CELLS AND RELATED METHODS

CROSS REFERENCE TO RELATED APPLICATIONS

This application is related to applicant's previously filed U.S. Appln. Ser. No. 62/928,802, filed on Oct. 31, 2019 and U.S. application Ser. No. 16/849,985, filed on Apr. 15, 2020, which are herein incorporated by reference.

BACKGROUND

Today, semiconductor devices and integrated circuits (IC) are designed by placing various standard or custom cells with different functions. For example, the designers, or EDA (Electronic Design Automation) or ECAD (Electronic Computer-Aided Design) tools may draw design layouts of the integrated circuits including standard or custom cells. The design layouts are converted to photomasks. Then, semiconductor integrated circuits can be manufactured, when patterns of various layers, defined by photography processes with the photomasks, are transferred to a substrate.

To perform different functions, electric power may be supplied to/from various cells, and signals may also be routed to/from the cells. With advancing technology, there is an ever-increasing demand for reducing the size of ICs with the same amount or more computational resources.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 6A, 6B-1 and 6B-2 illustrate a circuit structure in accordance with an embodiment of the present disclosure.

FIGS. 9D-1 and 9D-2 illustrate cross-sectional views of circuit structures according to the embodiments of the present disclosure.

FIGS. 10B-1, 10B-2, 10B-3 and 10B-4 illustrate cross-sectional views of circuit structures according to the embodiments of the present disclosure.

DETAILED DESCRIPTION OF THE DISCLOSURE

Figure 1A:
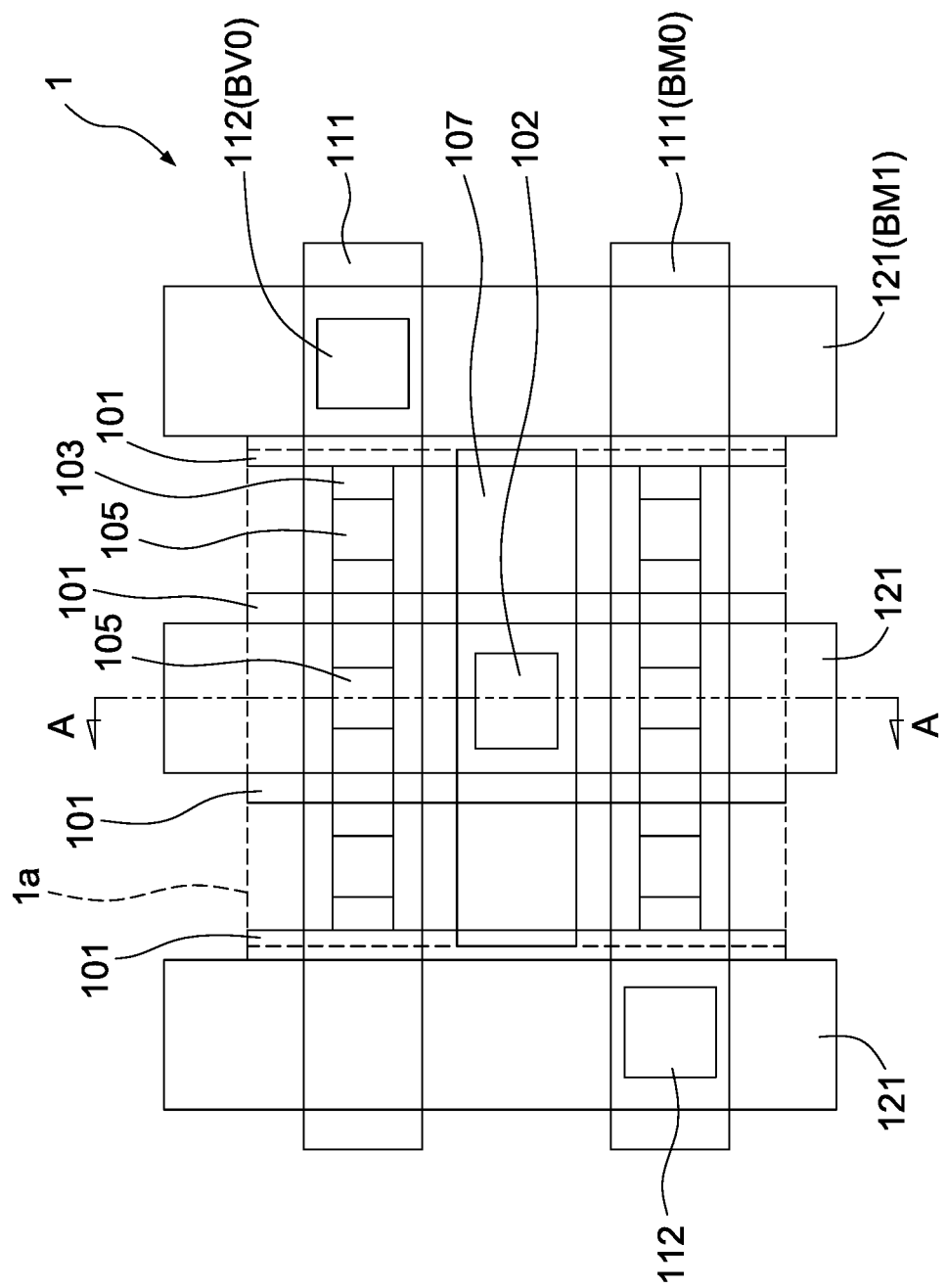
FIGS. 1A and 1B illustrate a circuit structure in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that in the present disclosure, one pattern/layer/structure/surface/direction being substantially parallel to another pattern/layer/structure/surface/direction means that the two patterns/layers/structures/surfaces/directions are parallel to each other, or the two patterns/layers/structures/surfaces/directions are intended to be configured to be parallel to each other but may not be perfectly parallel to each other due to design, manufacturing, measurement errors/margins caused by unperfected manufacturing and measurement conditions. Such a description should be recognizable to one of ordinary skill in the art.

It should be understood that in the present disclosure, one pattern/layer/structure/surface/direction being substantially perpendicular to another pattern/layer/structure/surface/direction means that the two patterns/layers/structures/surfaces/directions are perpendicular to each other, or the two patterns/layers/structures/surfaces/directions are intended to be configured to be perpendicular to each other but may not be perfectly perpendicular to each other due to design, manufacturing, measurement errors/margins caused by unperfected manufacturing and measurement conditions. Such a description should be recognizable to one of ordinary skill in the art.

In the present disclosure, two layers/patterns/structures being formed on a same level means that the two layers/patterns/structures have a same distance from a reference plane, for example, a surface of a substrate, based on which a semiconductor device is formed, or the two layers/patterns/structures are intended to be configured to have a same distance from a reference plane, for example, a surface of a substrate, based on which a semiconductor device is formed but may not perfectly have the same distance from the reference plane due to design, manufacturing, measurement errors/margins caused by unperfected manufacturing and measurement conditions. Such a description should be recognizable to one of ordinary skill in the art.

In the present disclosure, two layers/patterns/structures being formed on different level means that with consideration of variations/errors caused by, for example, surface roughness, the two layers/patterns/structures have different distances from a reference plane, for example, a surface of a substrate, based on which a semiconductor device is formed.

In the present disclosure, a layer, a pattern, or a structure extending in one direction means that a dimension of the layer, the pattern, or the structure in the extended one direction is greater than another dimension of the layer, the pattern, or the structure in another dimension substantially perpendicular to the extended one direction.

In the present disclosure, "about" or "approximately" used to describe a value of a parameter means that the parameter is equal to the described value or that the parameter is within a certain range of the described value, when design error/margin, manufacturing error/margin, measurement error etc. are considered. Such a description should be recognizable to one of ordinary skill in the art.

Any of the embodiments described herein may be used alone or together with one another in any combination. The one or more implementations encompassed within this specification may also include embodiments that are only partially mentioned or alluded to or are not mentioned or alluded to at all in this brief summary or in the abstract. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

In the present disclosure, the term "height" used in connection with a standard cell (e.g., "cell height" or a "height of standard cells") generally refers to a dimension (length or distance) along the column direction in a plan view.

Further, it will be understood that when an element is referred to as being "connected to" or "coupled to" another element, it may be directly connected to or coupled to the other element, or intervening elements may be present.

In the present disclosure, not every layer of a cell or a layout is depicted in the drawings. One of ordinary skill in the art should understand that the cell or the layout can include more layers to implement functionality of the cell and omitting these layers is merely for convenience of descriptions.

A semiconductor wafer (sometimes referred to simply as a "substrate") is typically a round piece of semiconducting material with two sides. Conventionally, circuit structures and semiconductor devices are made on only one side. This side is usually referred to as the "front side"; the other side, where no circuit structure is made, is referred to as the "back side."

Moore's Law essentially predicts that semiconductor device density in unit area can grow exponentially. To prolong the trend predicted by Moore's Law, one technique is to improve the manufacturing process to continue reducing the size of the smallest circuit element that can be possibly made with that manufacturing process. The advances in the manufacturing process are commonly indicated by a length quantity, such as 90 nm, 65 nm, 45 nm, 32 nm, 22 nm, 14 nm, 10 nm, 7 nm, 5 nm, 3 nm and 2 nm.

Another technique that helps prolong the Moore's Law trend is to move circuit structures from the front side to the hitherto unused back side. This technique essentially increases the number of circuit elements that can be made per unit area of wafer.

A comparative technique involves moving at least a part of the power grid from the front side of a wafer to the back side. The so-called back side power grid can help maintain different power domains and distribute them without occupying area on the front side. The freed-up area on the front side can be used for other circuit elements to enhance computing or memory capacity, or both.

It would be advantageous to utilize the back side of the wafer more efficiently.

In accordance with an embodiment of the present disclosure, an improved via (or via structure) is provided. The improved via can interconnect circuit elements on different layers on the back side. The improved via may then route electric signals among the connected circuit elements. The "different layers on the backside" may include active regions within or immediately on the wafer. Hence, the improved via may route electric signals among circuit elements on different sides of the wafer, enabling more efficient and flexible placement of circuit elements on the wafer.

In an embodiment, the improved via can interconnect circuit elements that are not in adjacent layers. Adjacent layers are layers designed to be vertically next to each other and can be connected to each other by vias between the two adjacent layers. Examples of adjacent layers include active regions and M0 on the front side, M0 and M1 on the front side, M1 and M2 on the front side, active regions and BM0 on the back side, BM0 and BM1 on the back side, BM1 and BM2 on the back side, etc. The improved via according to an embodiment of the present disclosure is sufficient long to allow direct electrical connection between, say active regions of the substrate and BM1. This could enable more flexible routing and placement. Moreover, the improved via possesses electrical characteristics (such as resistance characteristics, capacitive characteristics, RC characteristics and RC mismatch characteristics) of sufficient quality that allow not only electrical power but also electrical signals to pass through.

In short, the improved via that be implemented on the back side of a wafer and the associated circuit structures enable electrical signals (in addition to power) to be routed in the conductive layers on the back side. Advantageously, the wafer area, both on the front side and the back side, is more efficiently used. Also, the conductive layers on the back side can be used more efficiently.

More embodiments with varying degrees of details according to the present disclosure will be described below, with reference to the accompanying drawings. Note that different types of transistors may be used in conjunction with the embodiments of the present disclosure, such as planar MOSFETs and FinFETs. A typical FinFET device is fabricated with a silicon fin raised from a substrate. A device channel is formed in the fin. A gate is provided over (e.g., surrounding) the fin, and, for example, in contact with the top and the sidewalls of the fin. The gate's surrounding the channel (e.g., fin) is beneficial because it allows control of the channel from three sides. Besides FinFET structures, the Gate-All-Around (GAA) structure are also widely employed to create a smaller ICs.

Figure 1B:
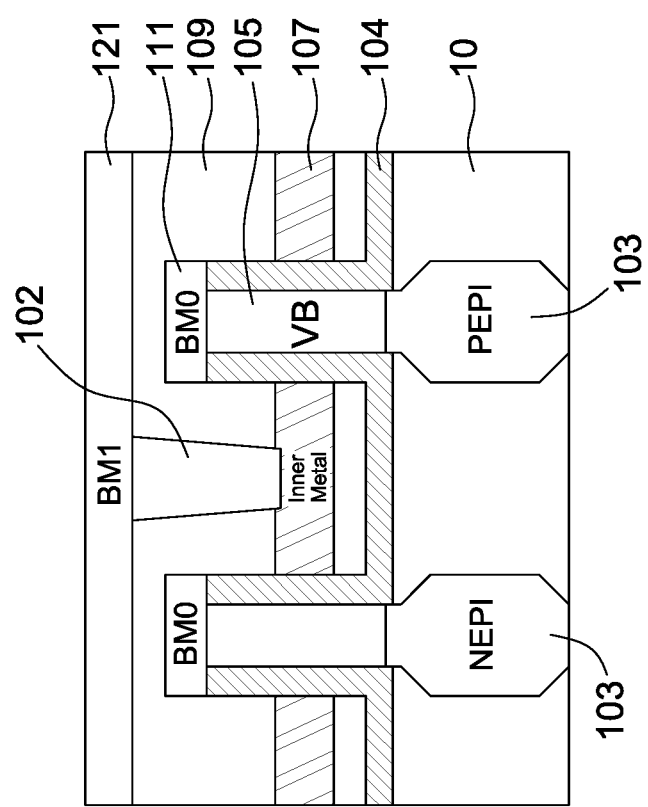

FIGS. 1A and 1B illustrate a circuit structure in accordance with an embodiment of the present disclosure. The illustrated circuit structure is a cell 1. The cell 1 may be an integrated circuit cell, and may be a standard cell or a customized cell. This is not a limitation to the present disclosure, though, and circuit structures other than cells are also possible.

FIG. 1A is a top-view of the back side of the cell 1, and FIG. 1B is a cross-section view of the cell 1 along the line A-A.

The cell 1 includes a portion of a substrate 10. The substrate 10 may be a semiconductor wafer, and active regions 103 may be made within or on the substrate 10. Semiconductor devices and circuit elements may be made on both sides of the substrate 10. FIG. 1B, however, only illustrates the circuit elements on the back side of the substrate 10. This fact is also indicated in the letter B of the abbreviations VB (commonly understood as the back side via), BM0 (commonly understood as back side metal layer 0) and BM1 (commonly understood as back side metal layer 1).

Elements that may exist in cell 1 include gate regions 101, active regions 103, an inner metal layer 107, conductive elements 111 in the BM0 layer and conductive elements 121 in the BM1 layer. These elements may be connected to each other by vias extending in a direction perpendicular to the (back side) surface of the substrate 10. These vias may include back side vias 105 (VB) that are connected to the substrate 10 (such as the active regions 103), a via 102 that may connect non-adjacent layers, and vias 112 (e.g., in BV0) that connect adjacent layers (e.g., BM0 and BM1). In the illustrated embodiment, the via 105 may be covered by strips 104. The elements mentioned in this paragraph may be surrounded by dielectric materials 109, such as oxides.

Although the front side of the substrate 10 is not illustrated in FIGS. 1A and 1B, it is understood that circuit elements can exist on the front side.

In an embodiment, the substrate 10 includes a silicon substrate. Other elementary semiconductors such as germanium and diamond may also be included. Alternatively, the substrate 10 may include a compound semiconductor such as silicon carbide, gallium arsenide, indium arsenide, or indium phosphide. Further, the substrate 10 may optionally include a silicon-on insulator (SOI) structure.

The gate regions 101 may include deposited poly gate material to form the gate terminals of transistors. The active regions 103 are made of or doped with semiconductor materials for forming the source/drain terminals of transistors. The gate regions 101 and active regions 103 may together form transistors. The materials in active regions 103 may include epitaxial silicon, epitaxial silicon germanium, and/or other suitable epitaxial materials. The two active regions 103 in FIG. 1B are illustrated with different patterns. However, this difference in illustration serves to indicate that the active regions may include different materials (such as N epitaxial material and P epitaxial material), and does not change the fact that they are both active regions.

Refer back to FIG. 1A. The cell 1 may include a cell boundary 1a to indicate the boundary with neighboring cells. The gate regions 101 and active regions 103 may together form several transistors in the cell 1 to implement various digital functionalities. Electric power and electric signals may be routed to and from the transistors and to and from different layers through different vias. The conductive elements 111 and 112 in BM0 and BM1 layer, respectively, may be coupled to the transistors.

The via 105 and via 112 are considered connecting two neighboring or adjacent layers. In an embodiment, the distance between two adjacent layers may be between 20 nm and 50 nm. That is, the distance between the surface of the substrate 10 and the BM0 layer may be between 20 nm and 50 nm, and the distance between the BM0 and BM1 layers may be between 20 nm and 50 nm. As such, the via 105 and via 112 may each have a length (or depth, considering that the length here is measured in a direction perpendicular to the substrate surface) of between 20 nm and 50 nm.

In an embodiment, the layer 107 is referred to as an inner metal layer. In an embodiment, the inner metal layer 107 may be considered at half a layer deep, because its distance from the surface of the substrate 10 is less than the distance between two adjacent layers, such as between the substrate surface and BM0 and between BM0 and BM1. In an embodiment, the layer 107 is placed at between about 55 percent and about 65 percent of the abovementioned range 20-50 nm. In an embodiment, the layer 107 is placed at about half way between the substrate surface and the BM0 layer. In an embodiment, the layer 107 is separated from the surface of the substrate 10 by between about 10 nm and about 25 nm. In an embodiment, the layer 107 may be used for in-cell connection.

Unlike the vias 105 and 112, the via 102 may be long enough to cross more than two layers. Refer back to FIG. 1B. The via 102 connects the conductive element 121 in BM1 layers to the inner metal layer 107, the two connected layers being not adjacent to each other. Hence, the via 102 depicted in FIG. 1B may be considered as connecting elements that are about "1.5 layer" apart. In an embodiment, a length of the via 102 is between about 155 percent and about 165 percent of the abovementioned range 20-50 nm. In an embodiment, a length of the via 102 is between about 30 nm and about 75 nm. In an embodiment, the via 102 may possess electrical characteristics that enable the routing of electrical power as well as electrical signals. Note that in FIG. 1B, the bottom end of the illustrated via 102 is slightly lower than the upper surface of the inner metal layer 107. This illustration indicates that the length of the via may be slightly longer or shorter than the designed length because of imperfection in actual fabrication process, such as non-idealities in etching and material growth. In other embodiments, the fabrication is sufficiently well-controlled that the via 102 does not "eat in" to the layer 107.

In the embodiment of FIG. 1B, the via 102 is illustrated to be funnel-like, or tapered. This shape reflects that, because the via 102 is longer than the other vias that may exist in the cell 1, it is more difficult to control the etching process for creating the space that eventually become the via 102 than the etching process for creating the space that eventually become other shorter vias, such as the via 105. That is, the relative length of different vias manifests itself in the difference in the profile shape of these vias.

The vias 102, 105 and 112 may each have an aspect ratio. The aspect ratio of an etched structure or a deposited structure is the ratio of the height of its vertical side wall to its width. This meaning is well understood by persons having ordinary skill in the art. In an embodiment, the vias 105 (backside vias VB) and 112 (the vias connecting BM0 and BM1 layers) may each have an aspect ratio between about 1.0 and about 2.0. The via 102, being longer than the other vias, may have a larger aspect ratio, such as between about 1.5 and about 3.0. In some embodiments, the aspect ratio of the via in the center of the cell may be about 150% of the aspect ratio of the other vias.

Figure 1C:
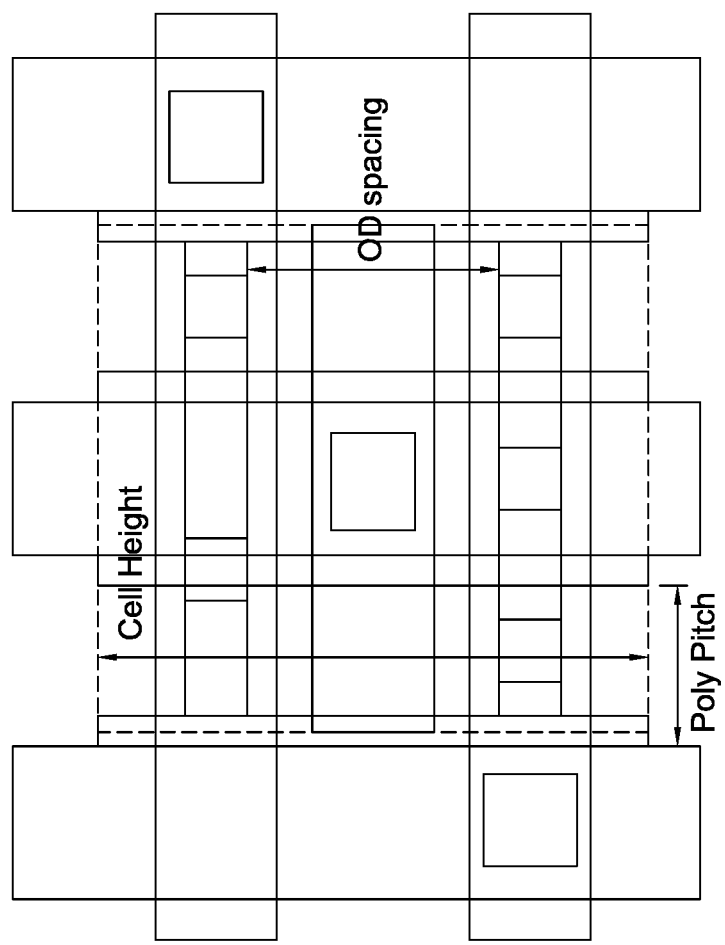
FIG. 1C illustrates a circuit structure in accordance with an embodiment of the present disclosure.

Refer to FIG. 1C, which illustrates a top-view of a circuit structure in accordance with an embodiment of the present disclosure. The circuit structure of FIG. 1C is similar to that illustrated in FIG. 1A, but the number and placement of the backside vias differ. For clarity and simplicity, circuit elements that are shared between FIGS. 1A and 1C are not repeatedly labeled.

FIG. 1C illustrates the relative sizes of various circuit elements in accordance with some embodiments of the present disclosure. As indicated in FIG. 1C, the term "cell height" refers to the height of the depicted cell and is, in this embodiment, approximately equal to the length of the gate regions. The term "poly pitch" refers to the spacing between adjacent gate regions. As mentioned above, the gate regions may be made of poly gate materials, and thus the word "poly" may be employed in the term "poly pitch" to refer to the pitch between the gate regions. The term "OD spacing" refers to the distance between the active regions. The abbreviation "OD" is used because it is common to use it to refer to the active regions of a semiconductor substrate.

In some embodiments, the term "cell height" may be abbreviated as "CH," the term "poly pitch" may be abbreviated as "PP," and the term "OD spacing" may be abbreviated as "ODS."

FIG. 1C illustrates that the cell height is larger than the OD spacing, which is in turn larger than the size (length or width) of a longer-than-usual via that is placed in the middle of the cell. In some embodiments, the ODS may be between about (0.15*CH) and about (0.45*CH) or between about (0.2*CH) and about (0.4*CH), and may be preferably between about (0.25*CH) and about (0.35*CH). In some embodiments, the size (length or width) of the longer-than-usual via placed in the middle of the cell may be between about (0.35*ODS) and about (0.5*ODS), and may be preferably between about (0.4*ODS) and about (0.5*ODS) or between about (0.4*ODS) and about (0.45*ODS).

In some embodiments, the size (length or width) of the longer-than-usual via placed in the middle of the cell may be quantified in its relationship with the cell height. In some embodiments, said size is between about 0.05 to about 0.25 times the cell height; that is, between about (0.05*CH) and about (0.25*CH). In some embodiments, said size (length or width) of the longer-than-usual via placed in the middle of the cell may be between about (0.07*CH) and about (0.2*CH).

In an embodiment, the cell height may be between about 80 nm and about 300 nm, between about 80 nm and about 200 nm, between about 80 nm and about 150 nm, between about 70 nm and about 140 nm, between about 60 nm and about 130 nm or between other ranges appropriate for the particular manufacturing process at hand. In an embodiment, the poly pitch may be between about 30 nm and about 50 nm, between about 35 nm and about 50 nm, between about 40 nm and about 50 nm, between about 45 nm and about 50 nm, or between other ranges appropriate for the particular manufacturing process at hand. In an embodiment, the width of the conductive elements in the BM0 layer is larger than the aforementioned ranges for poly pitches. In an embodiment, the width of the conductive elements in the BM1 layer is larger than the aforementioned ranges for poly pitches. In an embodiment, the size of the circuit elements increases as the layer in which the circuit elements are located is farther away from the substrate.

In an embodiment, the size of the via that connects the BM0 and BM1 layers may be between about 10 nm*10 nm and about 20 nm*20 nm. In an embodiment, the size of the back side via (i.e., the via that connects the BM0 layer to the substrate) may be between about 10 nm*10 nm and about 20 nm*20 nm, and may be larger or smaller than this range depending on the size of the conductive elements on the back side. In an embodiment, the size (area) of the longer-than-usual via placed in the middle of the cell may be between about 10 nm*10 nm and about 20 nm*20 nm. In some embodiments, the size of the via that connects the BM0 and BM1 layers and the size of the back side via may be between about 8 nm*8 nm and about 40 nm*40 nm for the manufacturing process nodes of 7 nm, 5 nm and 3 nm and other appropriate manufacturing process nodes. In some embodiments, the via sizes may be between about 10 nm*10 nm and about 20 nm*20 nm for these manufacturing process nodes.

Figure 2A:
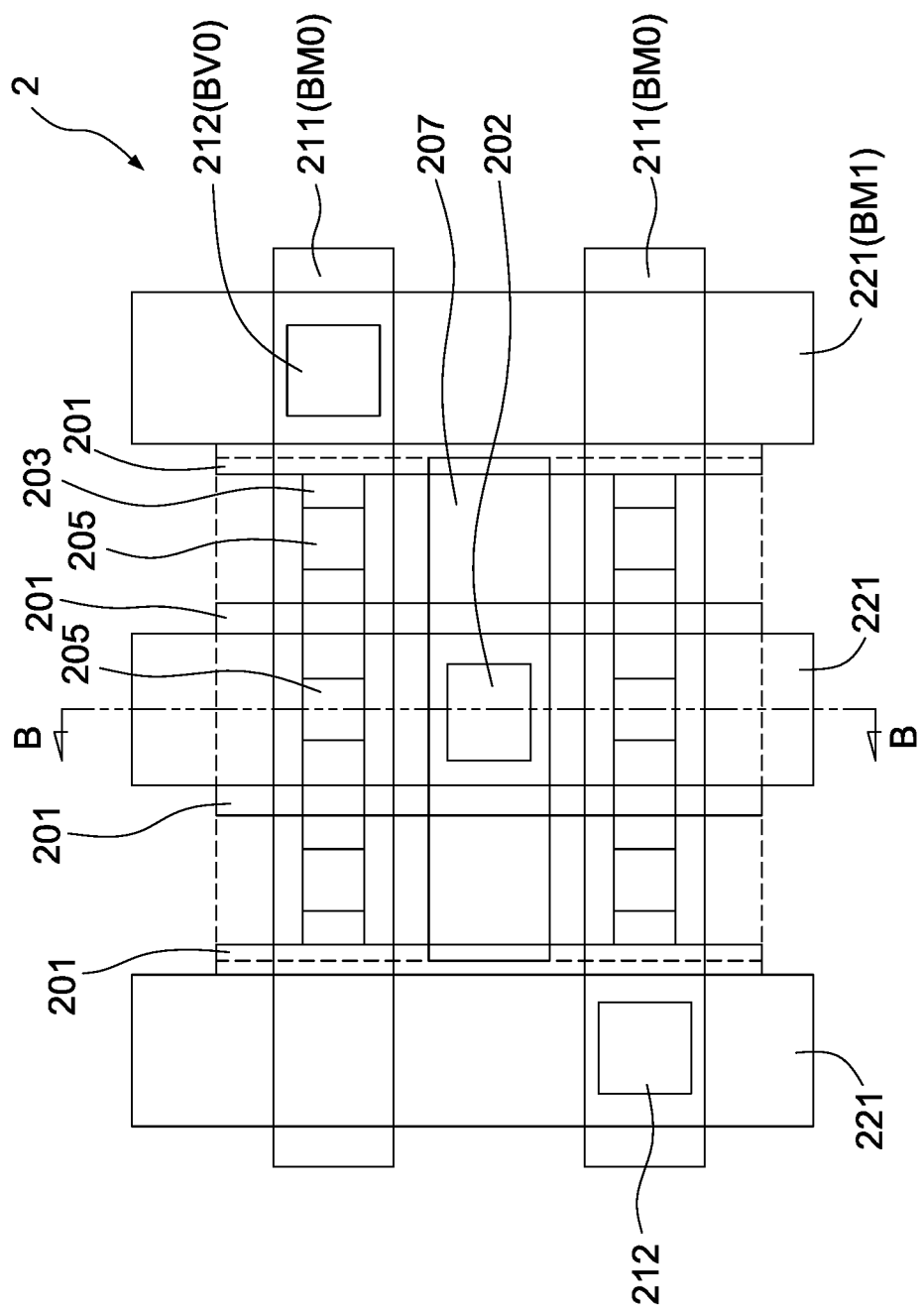
FIGS. 2A and 2B illustrate a circuit structure in accordance with an embodiment of the present disclosure.
Figure 2B:
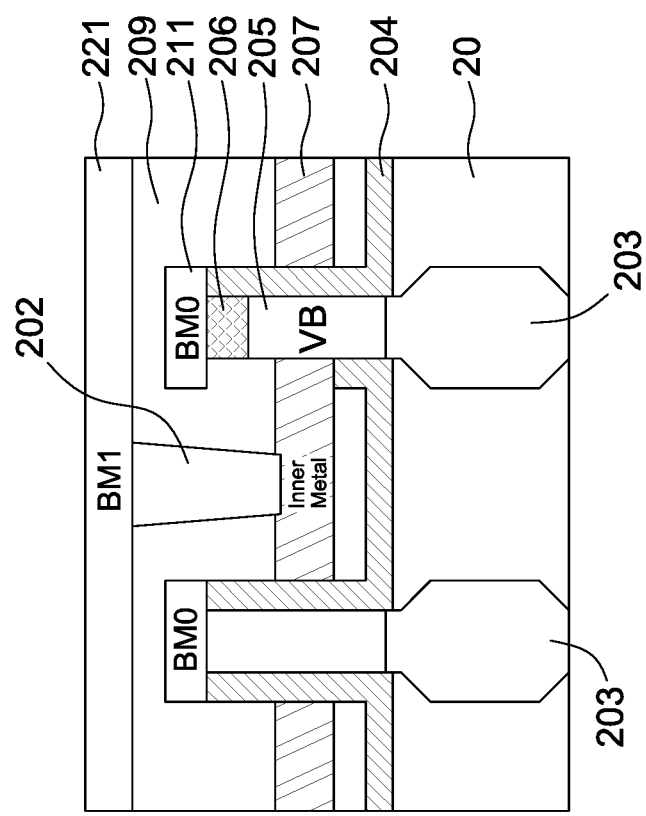

FIGS. 2A and 2B illustrate a circuit structure in accordance with an embodiment of the present disclosure. The illustrated circuit structure is a cell 2. FIG. 2A is a top-view of the back side of the cell 2, and FIG. 2B is a cross-section view of the cell 1 along the line B-B. Materials, configurations, layouts, dimensions, and/or elements that are identical to or similar to those described with respect to FIGS. 1A and 1B may be employed in the embodiment of FIGS. 2A and 2B and detailed explanation may thus be omitted.

The cell 2 includes a portion of a substrate 20, and active regions 203 may be made within or on the substrate 20. Elements that may exist in cell 2 include gate regions 201, active regions 203, an inner metal layer 207, conductive elements 211 in the BM0 layer and conductive elements 221 in the BM1 layer. Vias may exist in cell 2 to interconnect various circuit elements, such as the via 202, the via 205 and the via 212. The via 205 may be covered by strip 204. Dielectric material 209 may also exist in the cell 2.

The difference between the cell 2 and the cell 1 may be explained with reference to FIG. 2B. A portion of the strip 204 is removed so that the inner metal 207 is electrically connected to the via 205. This may enable more flexible connection and routing options. A hard-mask may also be used to enable more flexible connection and routing. In the embodiment illustrated in FIG. 2B, a hard-mask (HM) 206 is placed between the conductive element 211 in the BM0 layer and the via 205 to isolate them from each other and prevent electrical shorting between elements in the layer 207 and the conductive element 211 in the BM0 layer.

Figure 3:
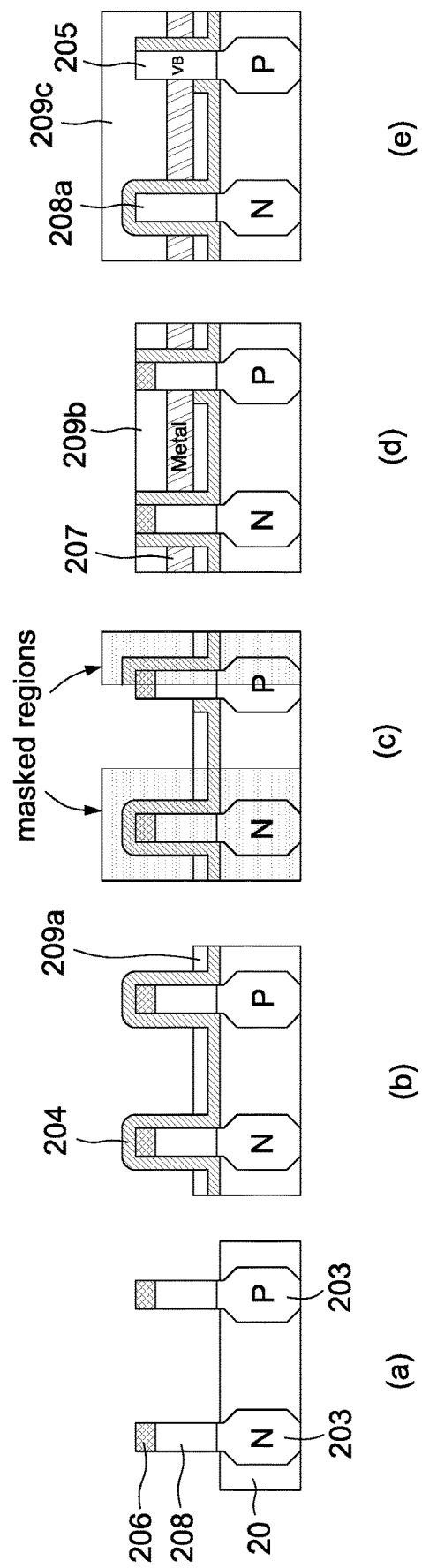
FIG. 3 schematically illustrates how a circuit structure can be made, in accordance with an embodiment of the present disclosure.

FIG. 3 schematically illustrates how a structure similar to that of FIG. 2B may be made. In step (a), a substrate 20 with active regions 203 is provided. Sacrificial materials 208 are provided on the respective active regions 203. Hard-masks 206 are provided on the respective sacrificial materials 208.

In step (b), a strip 204 is deposited, followed by dielectric material 209a. The strip 204 may comprise materials different from the dielectric material 209a in order to provide more flexible etching options. For examples, the strip 204 may comprise nitrides, and the dielectric material 209 may include oxides. That way, the portion of strip 204 under the dielectric material 209a may be protected while other portions of strip 204 are etched away. This effect can be seen in step (c), where etching is performed on the substrate 20 with two regions being masked to prevent the materials in these regions from being etched. The exposed portion of the strip 204 is being etched away.

In step (d), conductive materials may be deposited in the layer 207. Since a portion of the strip 204 of one of the sacrificial material block 208 is etched away, that sacrificial material block 208 is exposed, and the deposited conductive materials can become in contact with the sacrificial material block 208. Afterwards, dielectric material 209b may be deposited. Depending on circumstances, polishing may be done.

In step (e), the hard-masks 206 and the sacrificial materials 208 may be removed. The resulting openings may be filled with conductive material to form a backside via 205 (VB) or, if a via is not desired, filled with other material 208a, which may be dielectric material or spacer and may be covered by the strip 204 (which may contain nitrides) again. Afterwards, dielectric material 209c may be deposited. Depending on circumstances, polishing may be done.

Figure 4A:
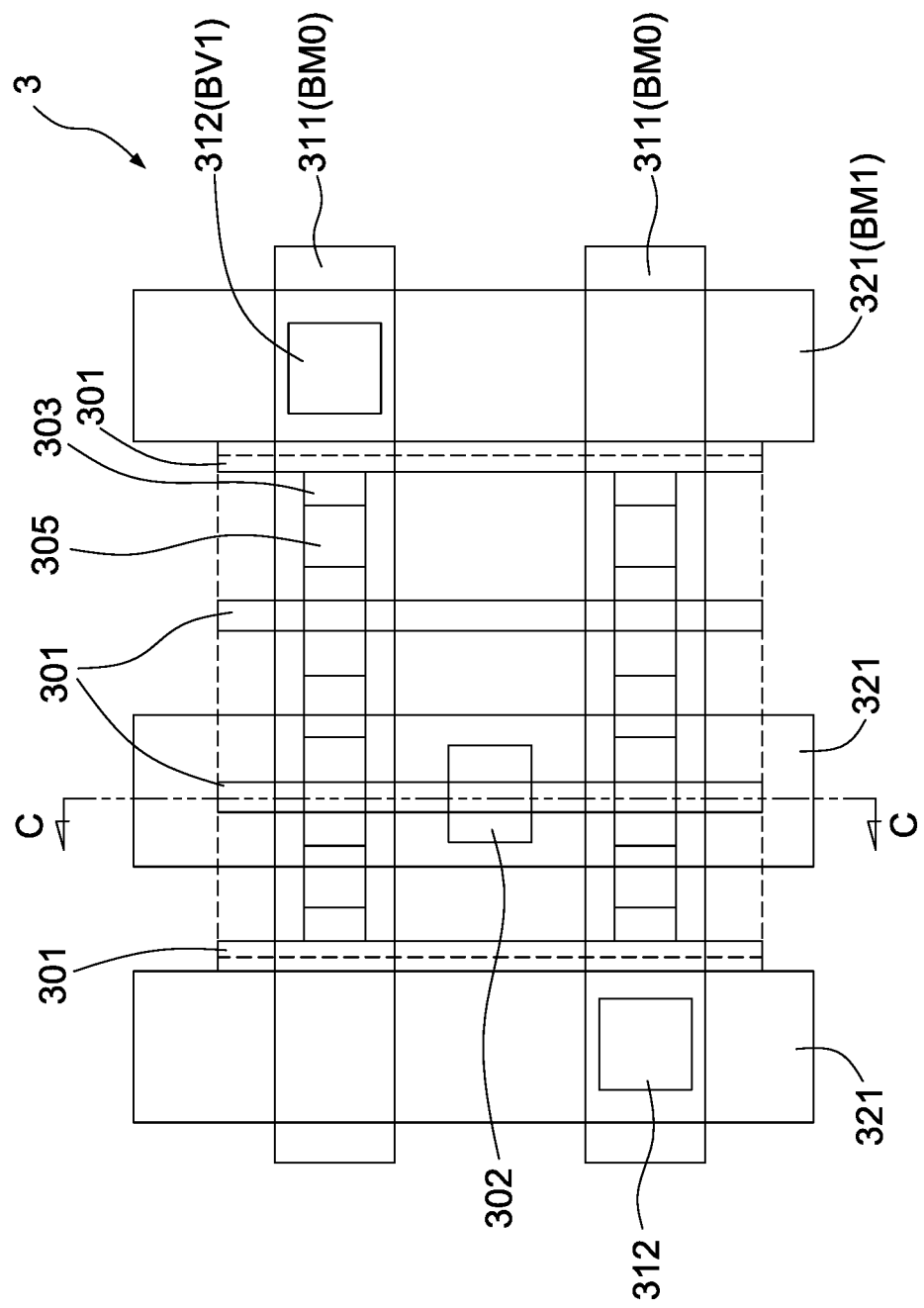
FIGS. 4A and 4B illustrate a circuit structure in accordance with an embodiment of the present disclosure.
Figure 4B:
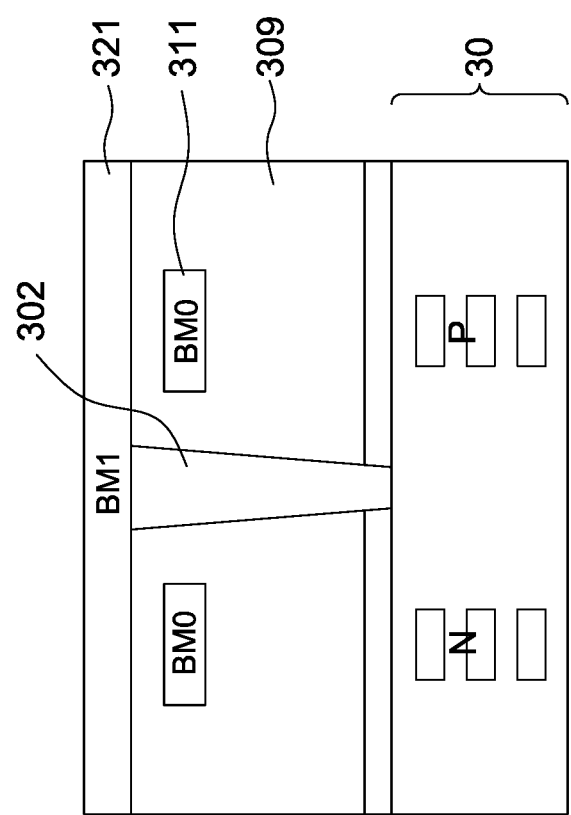

FIGS. 4A and 4B illustrate a circuit structure in accordance with an embodiment of the present disclosure. The illustrated circuit structure is a cell 3. FIG. 4A is a top-view of the back side of the cell 3, and FIG. 4B is a cross-section view of the cell 3 along the line C-C. Materials, configurations, layouts, dimensions, and/or elements that are identical to or similar to those described with respect to FIGS. 1A and 1B may be employed in the embodiment of FIGS. 3A and 3B and detailed explanation may thus be omitted.

The cell 3 includes a portion of a gate portion 30 of a substrate. Note the cross-sectional line C-C goes through one of the gate regions 301. In this embodiment, the transistor in the cell 3 has a Gate-All-Around (GAA) structure.

Other elements that may exist in cell 3 include active regions 303, conductive elements 311 in the BM0 layer and conductive elements 321 in the BM1 layer. Vias may exist in cell 3 to interconnect various circuit elements, such as the via 302, the via 305 and the via 312. Dielectric material 309 may also exist in the cell 3.

Unlike the embodiment of FIGS. 1A, 1B, 2A and 2B, the via 302 in the embodiment of FIGS. 4A and 4B is not placed right at the center of the cell 3. The embodiment illustrates the flexibility in the placement of the via 302. As seen in FIG. 4B, the via 302 directly connects the conductive element 321 in the BM1 layer to the gate portion 30 of the substrate and connects non-adjacent layers. This configuration allows more flexibility in routing the electrical signals to the gate terminals of the transistors.

Figure 4C:
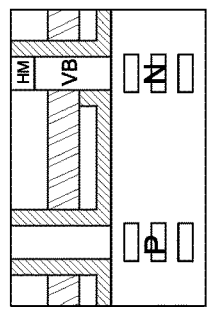
FIG. 4C schematically illustrates how a circuit structure can be made, in accordance with an embodiment of the present disclosure.
Figure 4C:
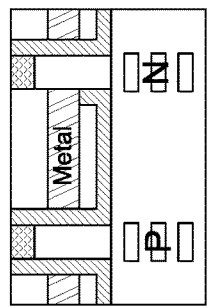
Figure 4C:
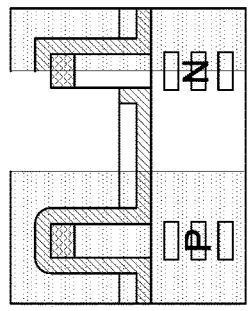
Figure 4C:
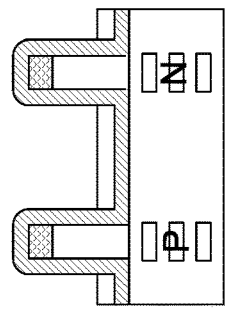
Figure 4C:
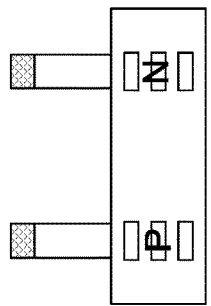

Structures similar to that illustrated in FIG. 2B can be made in the cell of the embodiment of FIGS. 4A and 4B, with reference to FIG. 4C.

The process illustrated in FIG. 4C is analogous to that of FIG. 3. One difference is that the process is applied on transistors with GAA structures. Another difference is that a hard-mask (HM) is provided above the back side via VB to provide more protection and/or electrical isolation.

Figure 5A:
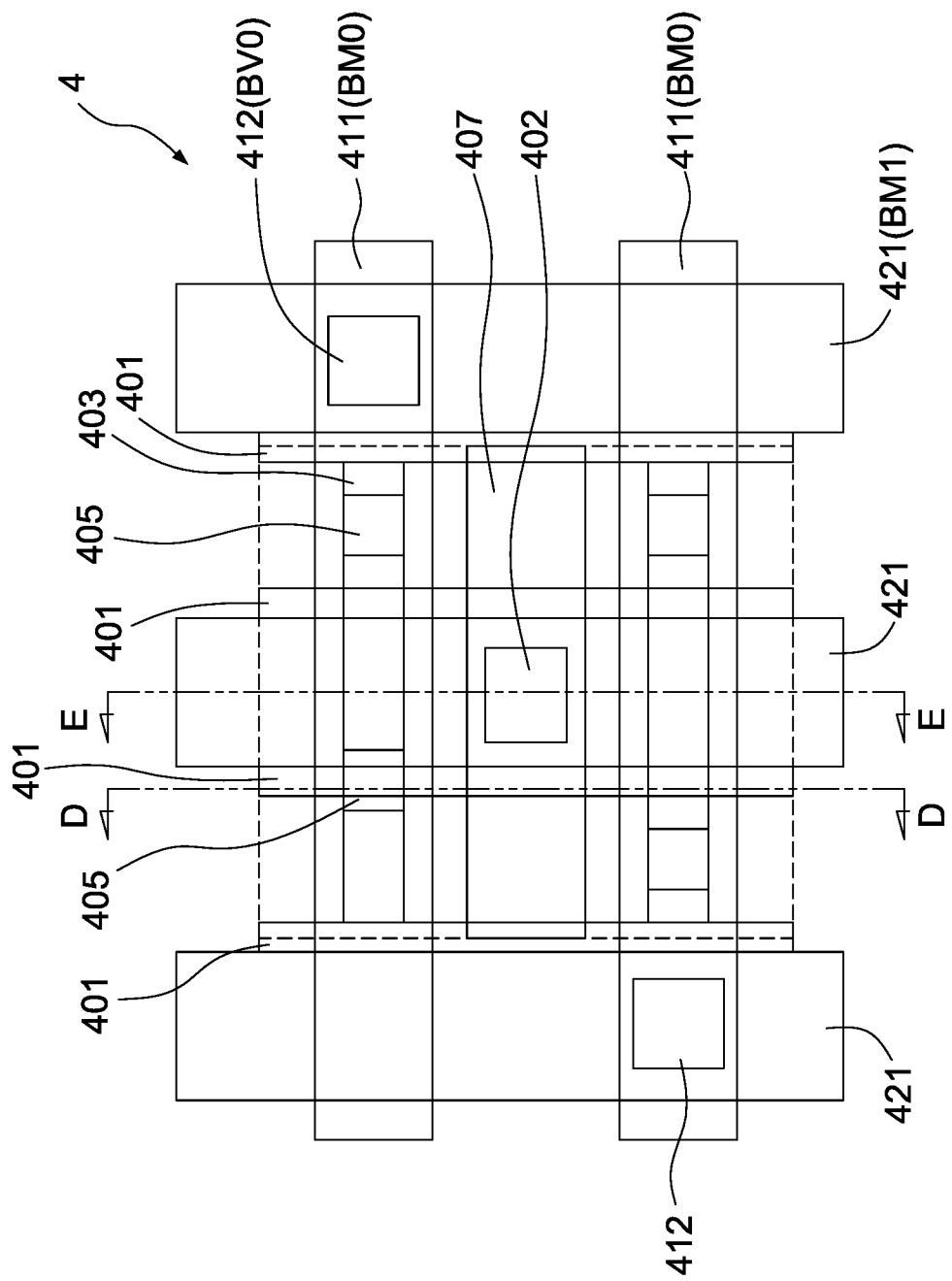
FIGS. 5A, 5B-1 and 5B-2 illustrate a circuit structure in accordance with an embodiment of the present disclosure.
Figures 2, 5B:
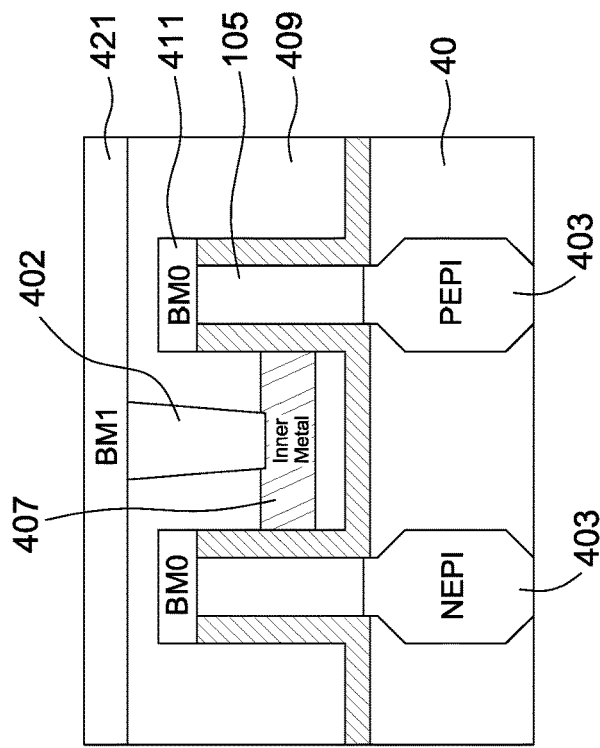
Figures 1, 5B:
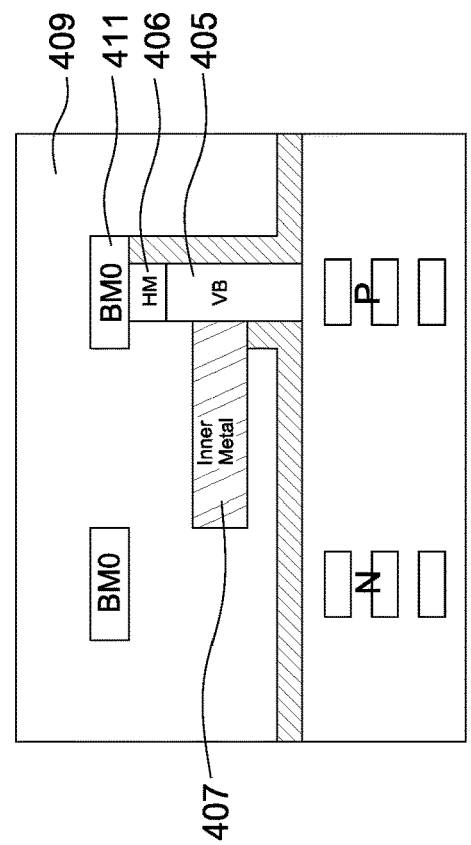

FIGS. 5A, 5B-1 and 5B-2 illustrate a circuit structure in accordance with an embodiment of the present disclosure. The illustrated circuit structure is a cell 4. FIG. 5A is a top-view of the back side of the cell 4. FIGS. 5B-1 and 5B-2 are cross-section views of the cell 4 along the lines D-D and E-E, respectively. Materials, configurations, layouts, dimensions, and/or elements that are identical to or similar to those described with respect to FIGS. 1A and 1B may be employed in the embodiment of FIGS. 5A, 5B-1 and 5B-2 and detailed explanation may thus be omitted.

The cell 4 includes a portion of a substrate 40, and active regions 403 may be made within or on the substrate 40. Elements that may exist in cell 4 include gate regions 401, active regions 403, an inner metal layer 407, conductive elements 411 in the BM0 layer and conductive elements 421 in the BM1 layer. Vias may exist in cell 4 to interconnect various circuit elements, such as the via 402, the via 405 and the via 412. The via 205 may be partially covered by strip 404. Dielectric material 409 may also exist in the cell 4.

One difference between the cell 4 and the cell 1 is the different number and placement of the backside vias 405, in order to illustrate the point that the configuration of the vias 405 is not a limitation to the present disclosure. The juxtaposition of different cross-sectional views illustrated in FIGS. 5B-1 and 5B-2 also presents a more comprehensive view of the cell 4.

As shown in FIG. 5B-1, the via 405 is provided to route electrical signals between the inner metal layer 407 and the GAA structures of transistors in the cell 4. A hard-mask 406 is provided to isolate the conductive element in the BM0 layer from the via 405.

FIG. 5B-2 illustrates that the via 402 connects the conductive element 421 to the inner metal layer 407. The via 402 connects non-neighboring layers, thereby allowing for more flexible signal routing options.

Figure 6A:
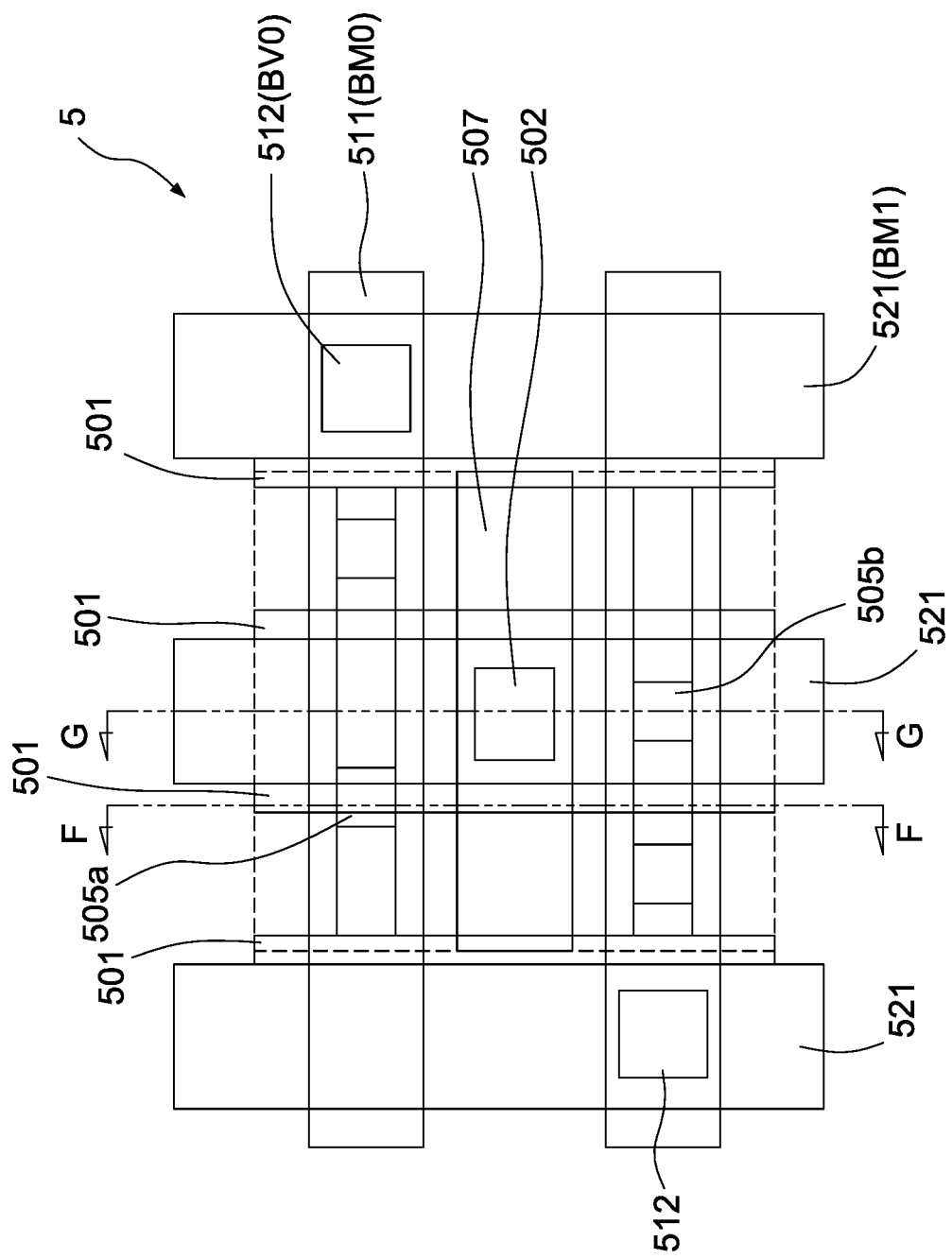
Figures 2, 6B:
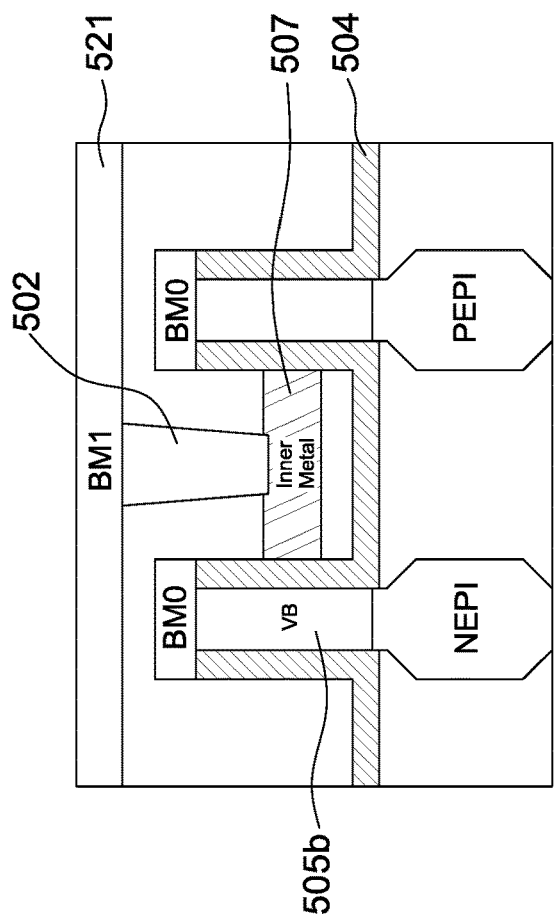
Figures 1, 6B:
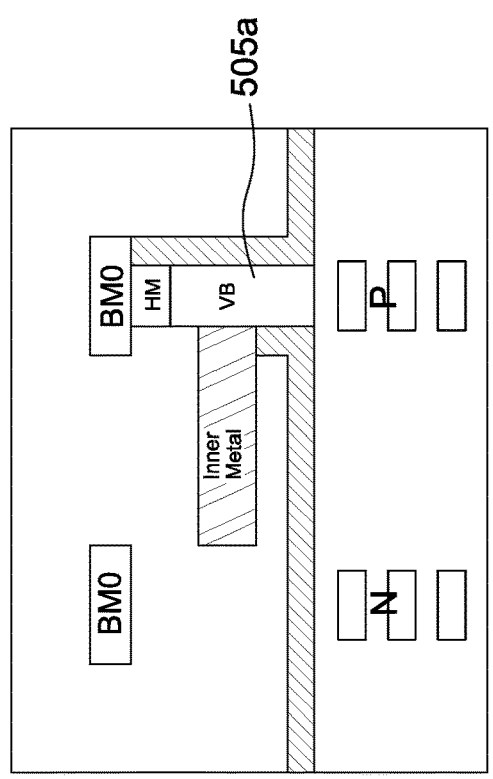

FIGS. 6A, 6B-1 and 6B-2 illustrate a circuit structure in accordance with an embodiment of the present disclosure. The illustrated circuit structure is a cell 5. FIG. 6A is a top-view of the back side of the cell 5. FIGS. 6B-1 and 6B-2 are cross-section views of the cell 5 along the lines F-F and G-G, respectively. Materials, configurations, layouts, dimensions, and/or elements that are identical to or similar to those described with respect to FIGS. 1A and 1B may be employed in the embodiment of FIGS. 6A, 6B-1 and 6B-2 and detailed explanation may thus be omitted.

FIGS. 6A, 6B-1 and 6B-2 illustrate an embodiment where the backside vias 505a and 505b can route signals out of the gate and source/drain regions of a transistor to the inner metal layer 507. Electric signals can then, thanks to the routing plan enabled by the via 502 that can connect non-adjacent layers, be directly routed to the conductive element 521 in the BM1 layer and then perhaps be routed to outside the cell 5 and even outside the semiconductor die in which the cell 5 is located. That is, it is possible for the electrical signals to be sent to and from the transistors on the substrate with the BM0 layer bypassed. The benefits may include higher circuit density enabled by more flexible routing plan, and lower resistive loss thanks to the more direct routing plan.

Figure 7A:
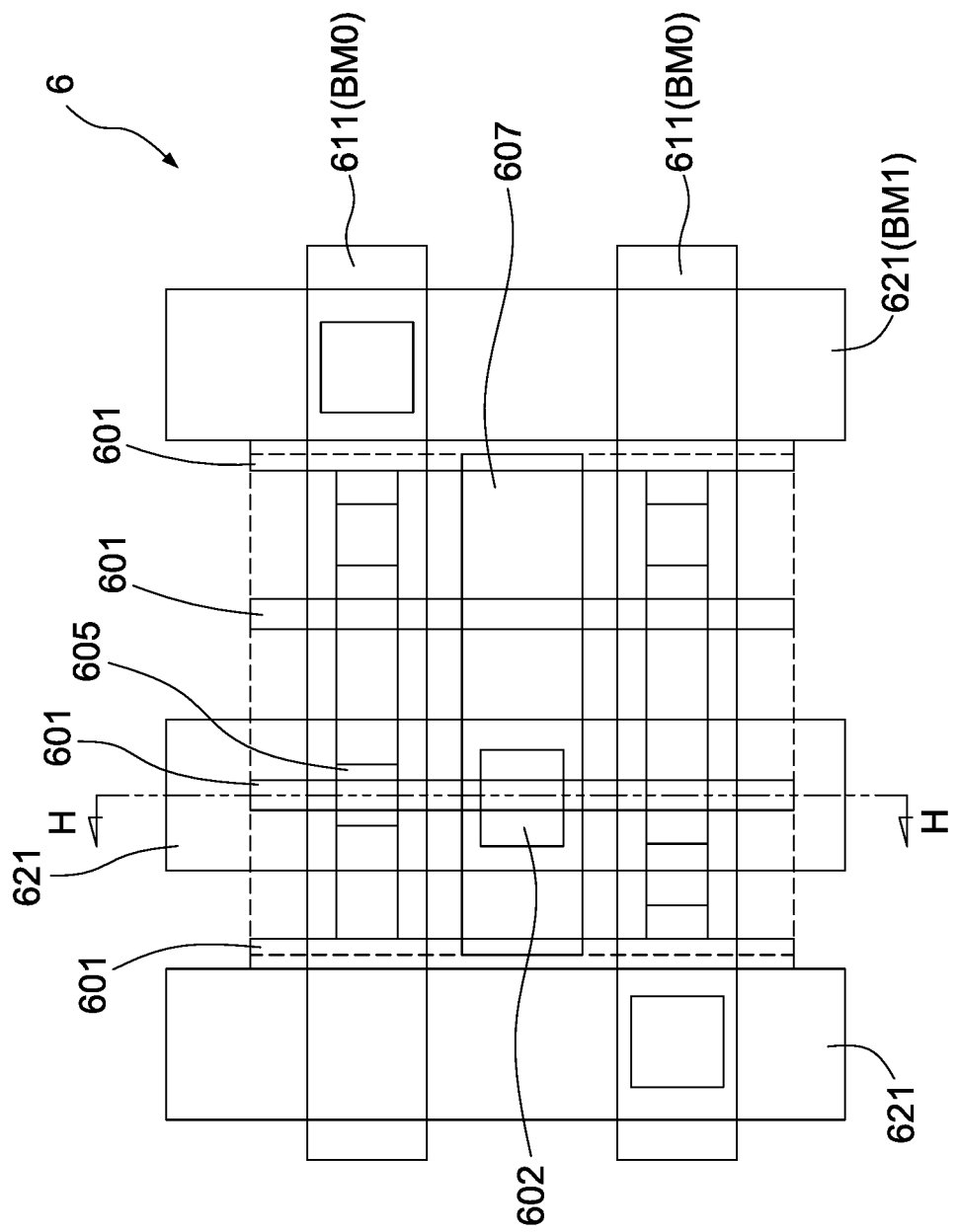
FIGS. 7A and 7B illustrate a circuit structure in accordance with an embodiment of the present disclosure.
Figure 7B:
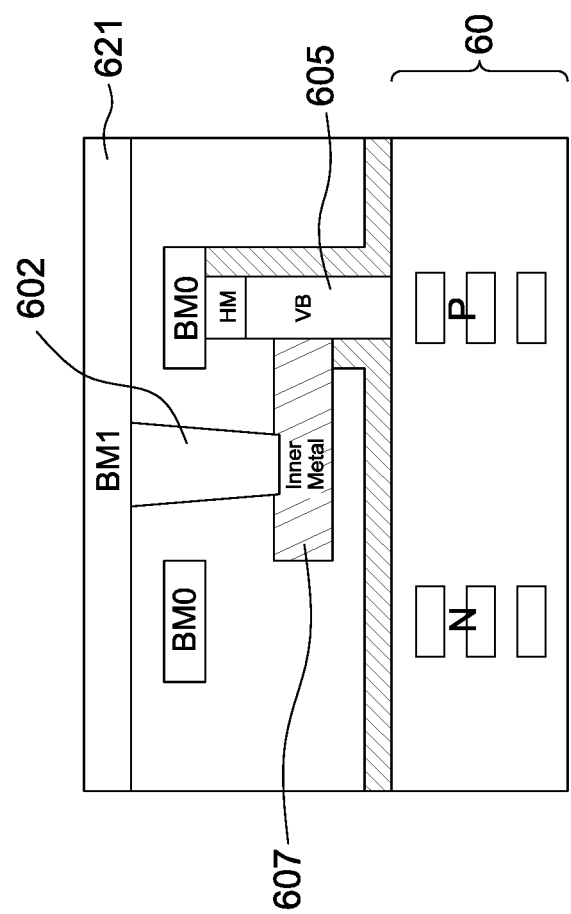

FIGS. 7A and 7B illustrate a circuit structure in accordance with an embodiment of the present disclosure. The illustrated circuit structure is a cell 6. FIG. 7A is a top-view of the back side of the cell 6, and FIG. 7B is a cross-section view of the cell 6 along the line H-H. Materials, configurations, layouts, dimensions, and/or elements that are identical to or similar to those described with respect to FIGS. 1A and 1B may be employed in the embodiment of FIGS. 7A and 7B and detailed explanation may thus be omitted.

Compared to the embodiment of FIGS. 6A, 6B-1 and 6B-2, the embodiment of FIGS. 7A and 7B enables signals to be more directly routed from the gate region 601 to the conductive element 621 in the BM1 layer, thanks to the realizable length of the via 602 and the flexibility in placing the via 602 to be above the gate regions 601.

Figure 8:
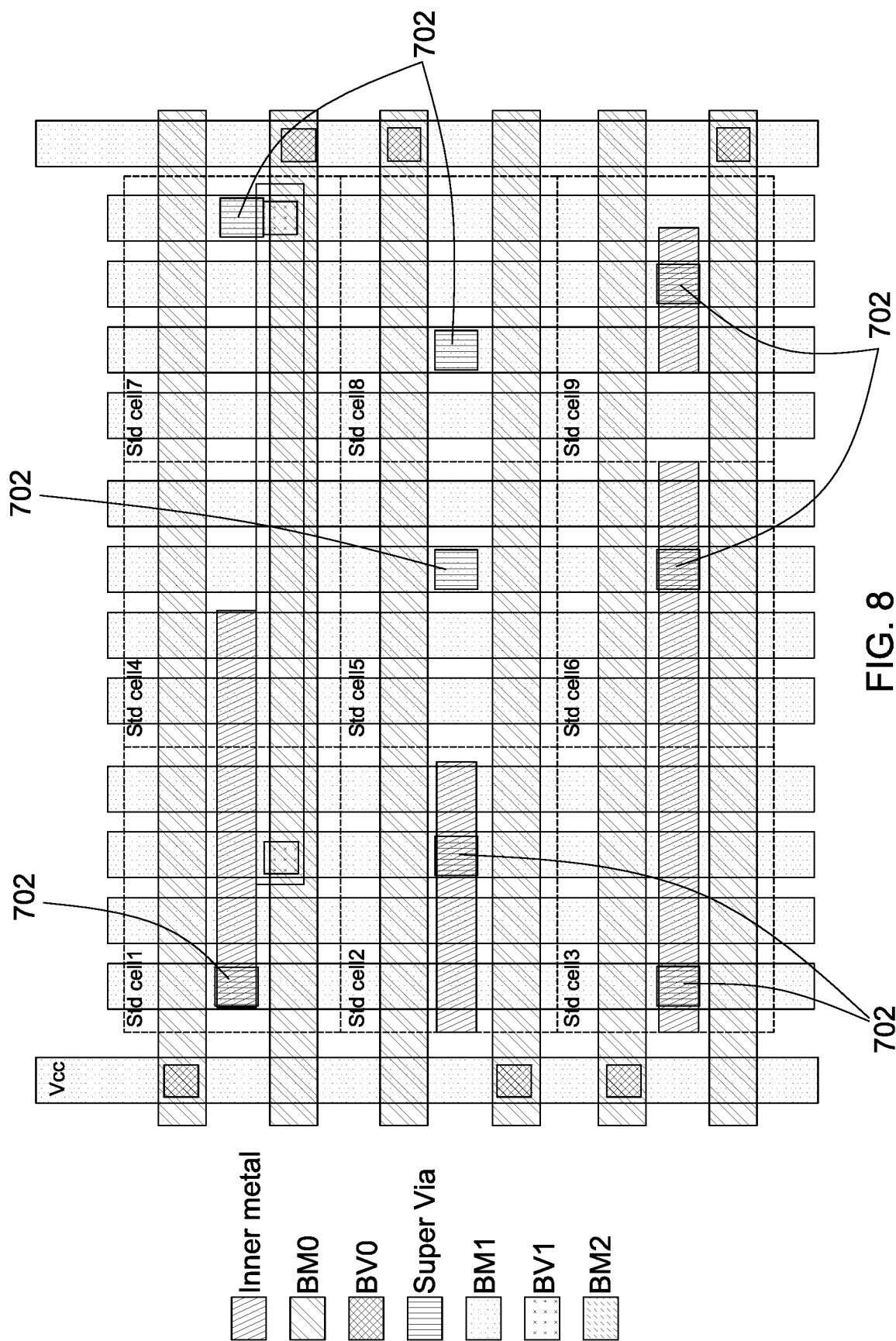
FIG. 8 illustrates a top-view of a backside of a substrate according to an embodiment of the present disclosure.

FIG. 8 illustrates a top-view of a backside of a substrate according to an embodiment of the present disclosure. For clarity, the substrate is not explicitly illustrated.

In FIG. 8, a plurality of neighboring cells are shown. Some or all of these cells can be standard cells provided by the manufacturing service provider to IC designers, while other cells can be customized by the IC designers. Vias such as those labeled with BV0 and BV1 can electrically connect neighboring layers, such as BM0 and BM1, and BM1 and BM2, respectively.

The vias 702, also labeled as "super vias" in FIG. 8 to express their capability to be longer and connect non-neighboring layers, connect conductive elements in the BM1 layer to a place below the BM0 layer. The super vias in cells 1, 2, 3, 6 and 9 provide a direct routing path from the BM1 layer to the inner metal layer. The super vias in cells 5, 7 and 8 provide a direct routing path from the BM1 layer to the surface of the substrate.

Figure 9A:
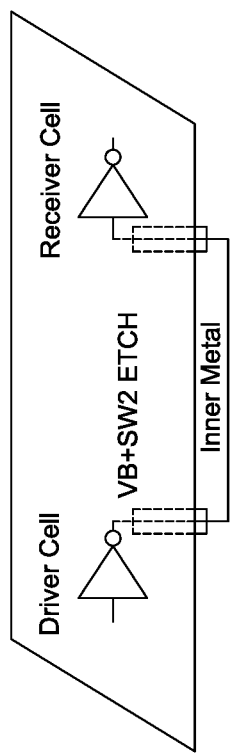
FIGS. 9A, 9B and 9C schematically illustrate an application of the embodiments of the present disclosure to the design of integrated circuits.
Figure 9B:
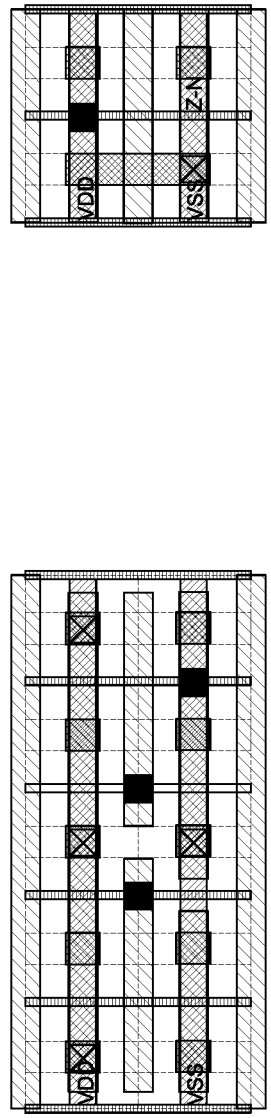
Figure 9C:
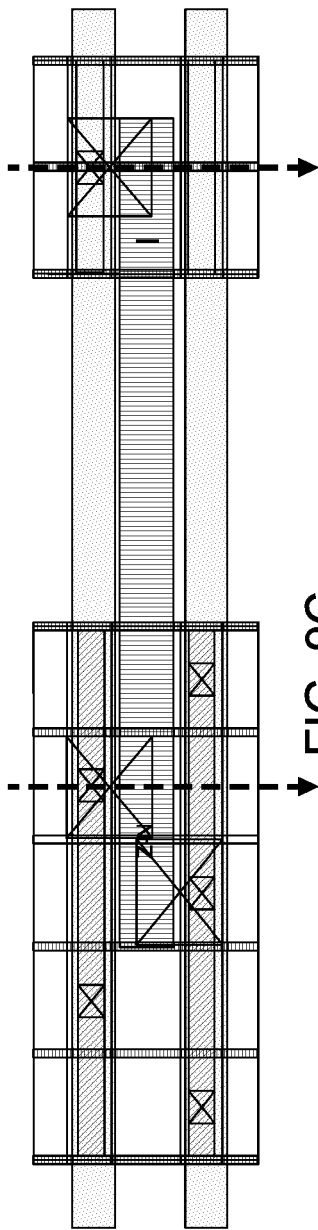

FIGS. 9A, 9B and 9C schematically illustrate an application of the embodiments of the present disclosure to the design of integrated circuits.

In FIG. 9A, a driver cell and a receiver cell exist on the front side of a substrate. The two cells are in the same row in the illustrated embodiment, although the same-row configuration is not a limitation to the present disclosure.

To save space on the front side, the output of the driver cell (which may consist of several transistors) is routed to the inner metal layer by way of backside vias (VB) and/or side wall spacer etching (SW2 ETCH). Note that, unlike the BM0 layer, the inner metal layer is usually considered half a layer away from the backside surface of the substrate. The signals from the output of the driver cell can then be routed on the backside to the input of the receiver cell.

FIG. 9B is a layout of the front side of the driver cell and receiver cell depicted in FIG. 9A. FIG. 9C is a layout of the back side of the driver cell and receiver cell depicted in FIG. 9A. It can be seen from FIG. 9C that the output ZN of the driver cell (on the left) is routed to the input I of the receiver cell (on the right).

Figures 2, 9D:
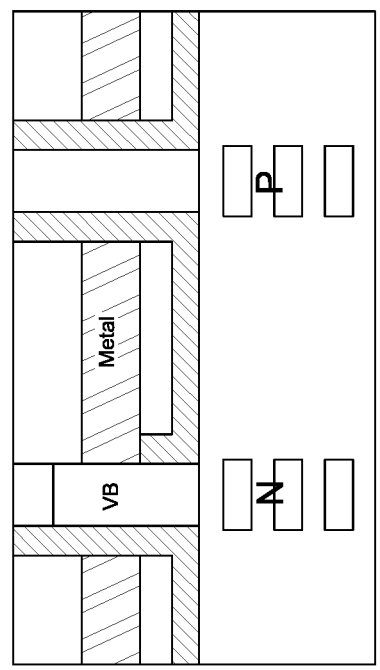
Figures 1, 9D:
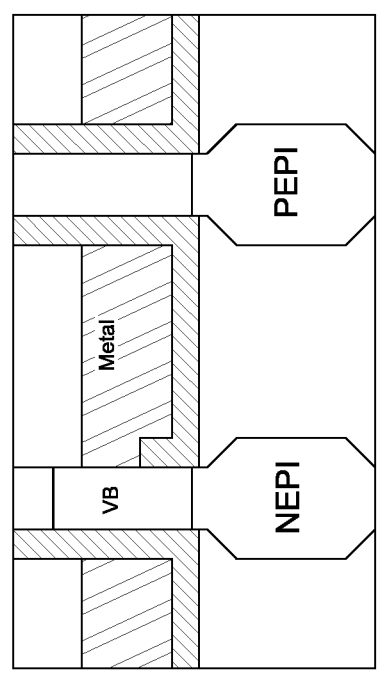

FIGS. 9D-1 and 9D-2 illustrate cross-sectional views of circuit structures that can be used in conjunction with the application depicted in FIG. 9A, in accordance with embodiments of the present disclosure. The output signal from a source/drain region of a transistor of the driver cell is routed through a backside via (VB) to the inner metal layer (FIG. 9D-1), and is then routed to another backside via (VB) in a transistor of the receiver cell (FIG. 9D-2), and finally reaches the gate region of that transistor of the receiver cell.

Figure 10A:
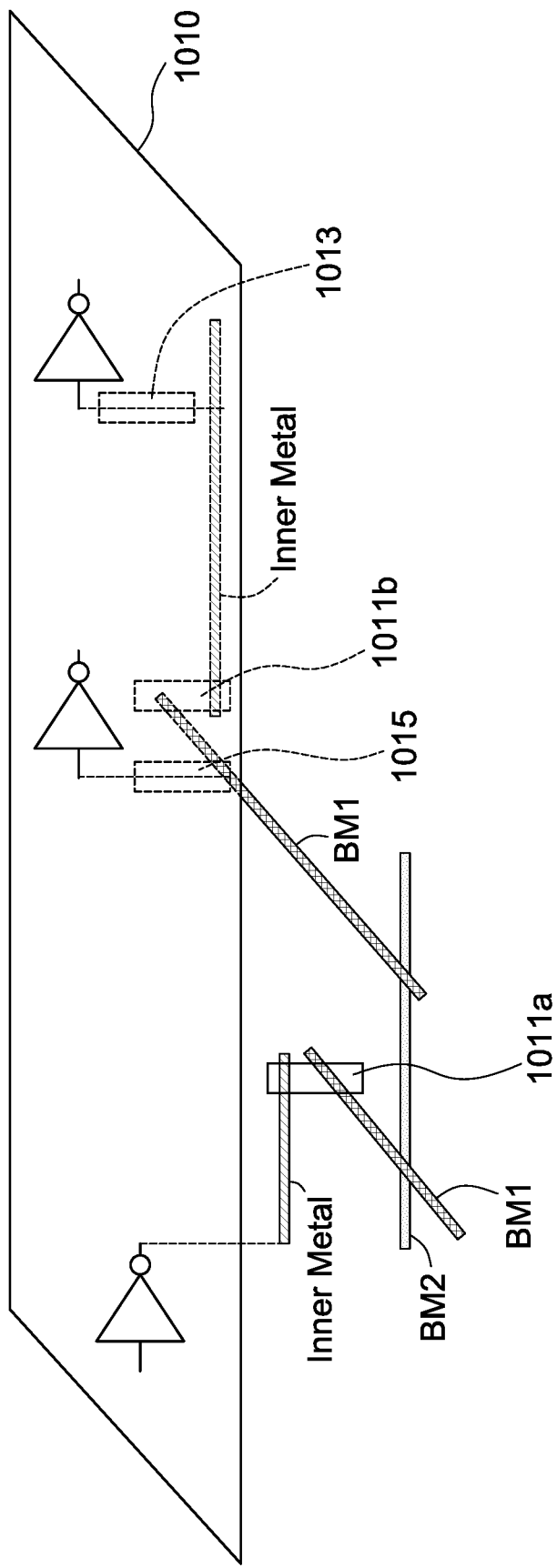
FIG. 10A schematically illustrates an application of the embodiments of the present disclosure to the design of integrated circuits.

FIG. 10A schematically illustrates an application of the embodiments of the present disclosure to the design of integrated circuits.

In FIG. 10A, three circuits in the same circuit cell exist on the front side of a substrate 1010. Although the three circuits are illustrated with the symbol of an inverter, this is merely for ease of explanation and does not constitute any limitation to the present disclosure. That is, the three circuits may be logic gates or digital circuits other than the inverter.

To save space on the front side, a signal from the output of the circuit on the left (which may consist of several transistors) is routed to the inner metal layer on the back side by way of backside vias (VB). A super via 1011a (i.e., a via capable of connecting two non-adjacent layers) routes the signals from the inner metal layer directly to the BM1 layer. The signal can then be routed to the BM2 layer by a normal, shorter via (not illustrated in FIG. 10A), and then to another conductive element in the BM1 layer.

Afterwards, the via 1013 and the super via 1015 connected in parallel can route the signal in two different directions to the circuit in the center and the circuit on the right (each of which may consist of one or more transistors), respectively.

The super via 1015 can route the signal from the BM1 layer directly to the gate of the input transistors of the circuit in the middle.

The super via 1011b and the via 1013 can route the signal to the input of the circuit on the right. The super via 1011b routes the signal from the BM1 layer directly to the inner metal layer; the via 1013 (a backside via in this case) routes the signal from the inner metal layer to the input of the circuit on the right.

It is clearly illustrated that multiple layers on the back side of a substrate can be used for routing electrical signals.

FIGS. 10B-1, 10B-2, 10B-3 and 10B-4 illustrate cross-sectional views of circuit structures that can be used in conjunction with the application depicted in FIG. 10A, in accordance with embodiments of the present disclosure.

Figures 1, 10B:
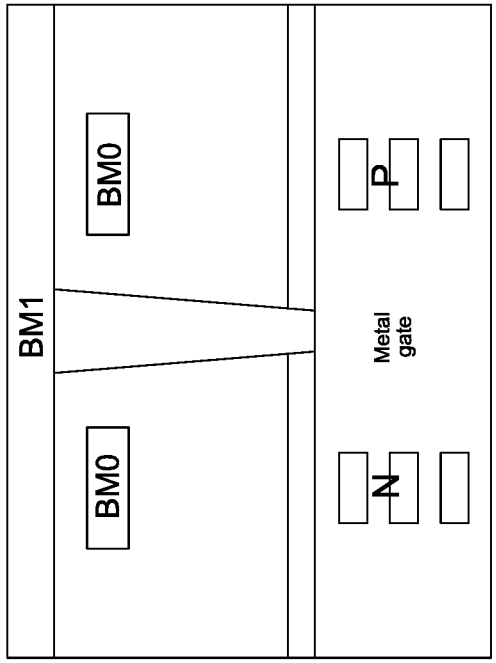
Figures 2, 10B:
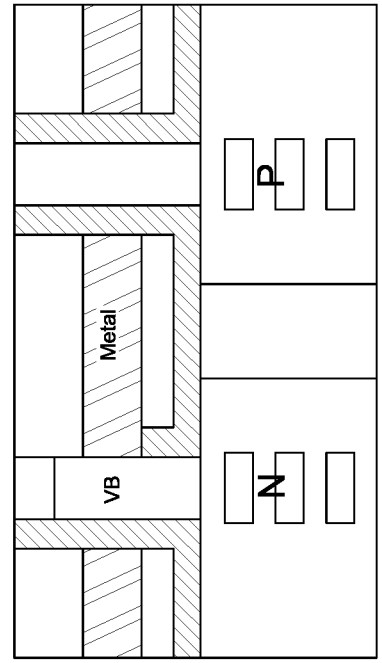
Figures 3, 10B:
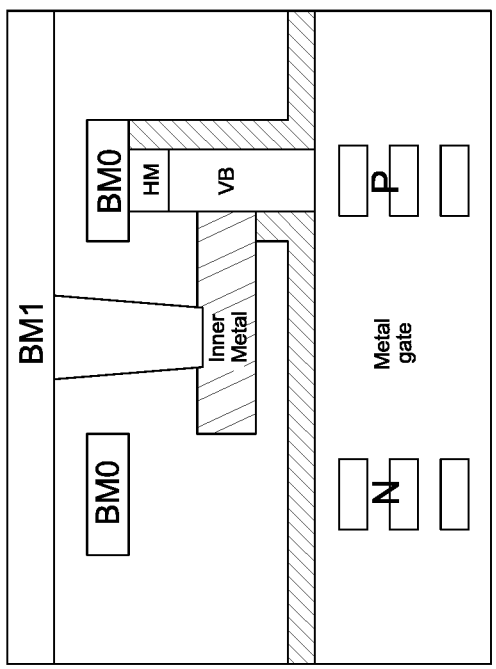
Figures 4, 10B:
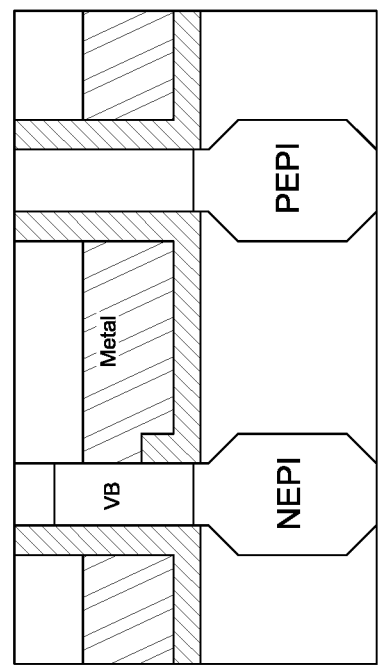

FIGS. 10B-1 and 10B-2 illustrate exemplary circuit structures that can be used to implement the super via 1011a and the super via 1015, respectively. FIGS. 10B-3 and 10B-4 illustrate exemplary circuit structures that can be used to implement backside vias that connect the inner metal layer to the substrate, either the source/drain region of a transistor (FIG. 10B-3) or the gate region of a transistor (FIG. 10B-4).

Figure 11:
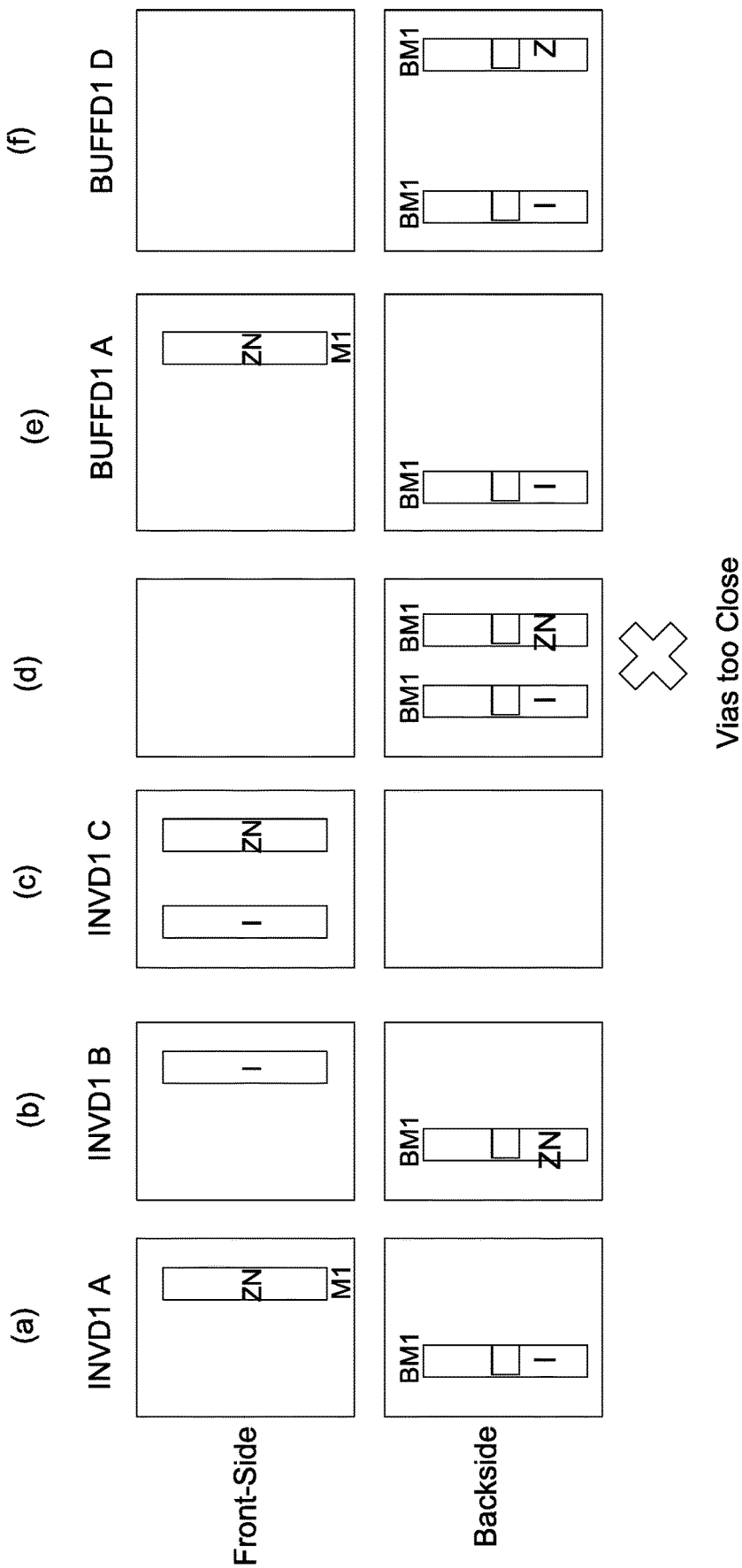
FIG. 11 schematically illustrates examples of possible via placement, according to some embodiments of the present disclosure.

FIG. 11 schematically illustrates examples of possible placement of super vias that can extend more than one layer, according to some embodiments of the present disclosure. Each of parts (a), (b) and (c) illustrate the front side and the back side of an inverter.

In part (a), signals can be routed from the BM1 layer on the back side directly to the input I (which may be a gate region or an active/source/drain region of a transistor); the inverter output ZN can then be routed to the M1 layer on the front side.

In part (b), signals can be routed from the M1 layer on the front side to the input I; the inverted signal may then come out of the output ZN and be routed to directly from the substrate level to the BM1 layer on the back side by way of a super via that can span multiple layers.

In part (c), both the input I and output ZN are routed via the front side.

Like typical, shorter vias, the super vias also have to follow design rules that dictate minimum spacing between different layout patterns. Part (d) shows an example where the super vias are too close to each other to comply with the design rules.

Parts (e) and (f) illustrate the front side and the back side of a buffer. The detailed description is similar to the description of parts (a), (b) and (c) and thus is omitted. It is possible that the input and output of the buffer are both connected to the routing paths on the backside, as shown in part (f).

Figure 12:
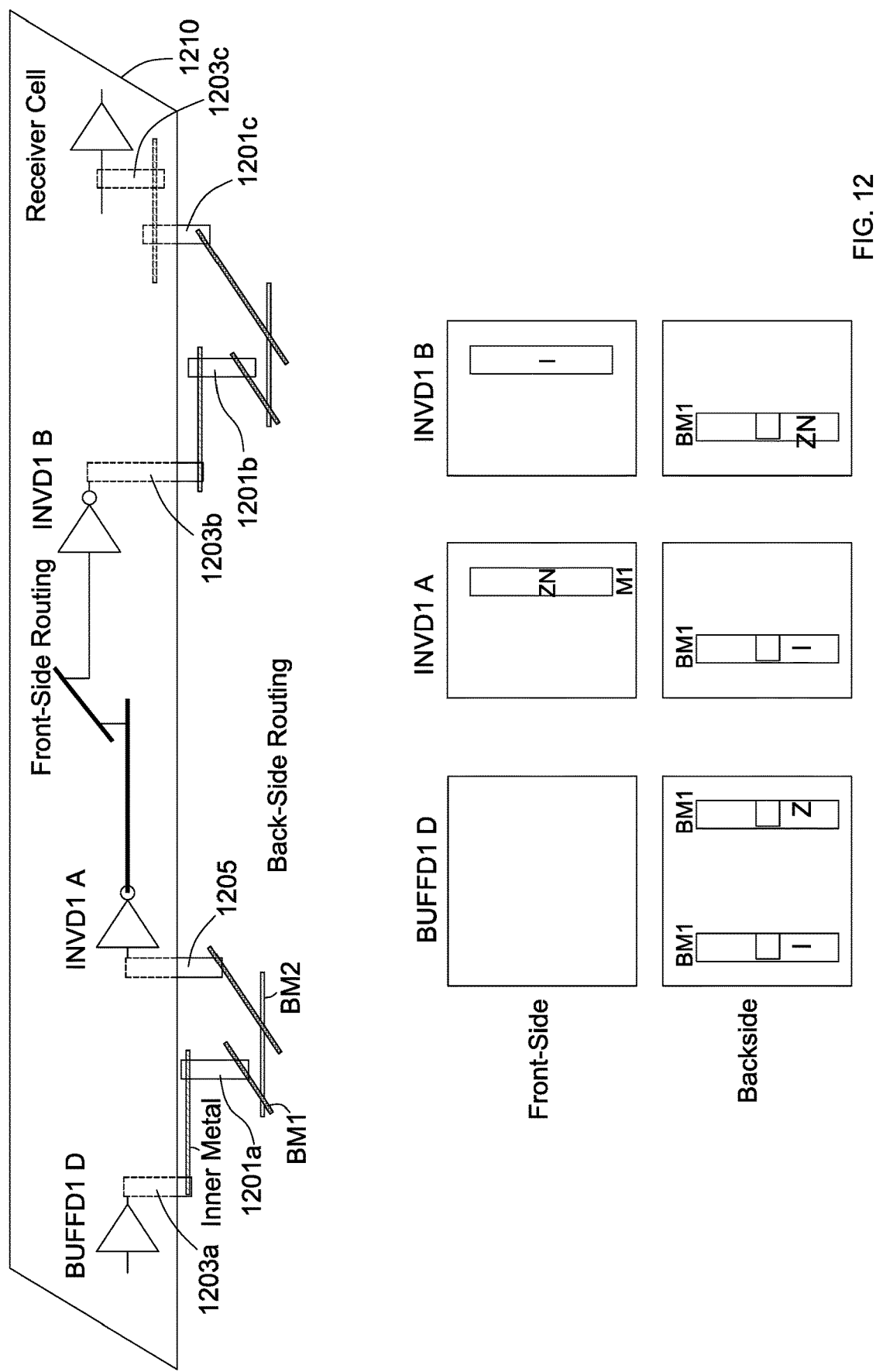
FIG. 12 schematically illustrates an application of the embodiments of the present disclosure to the design of integrated circuits.

FIG. 12 schematically illustrates an application of the embodiments of the present disclosure to the design of integrated circuits.

The top part of FIG. 12 illustrates four circuits (a buffer BUFFD1 D, two inverters INVD1 A and INVD1 B, and a receiver) that exist on a substrate 1210. The bottom part of FIG. 12 schematically illustrates examples of possible placement of super vias that can extend more than one layer, in a fashion similar to FIG. 11.

The input I and output Z of the buffer BUFFD1 D are both routed with the conductive tracks on the back side. Super vias that can connect non-adjacent layers or circuit elements on different levels are used to increase routing flexibility. A backside via 1203*a* connects the output Z to the inner metal layer, and a super via 1201*a* directly connects the inner metal layer to the BM1 layer without having to stop at the BM0 layer.

Signals from the output Z of the buffer BUFFD1 D can then be routed in multiple layers on the back side and reach the input I of the inverter INVD1 A by way of the super via 1205 that directly connects the BM1 layer to the gate region on the substrate level.

In the example of FIG. 12, the output ZN of the inverter INVD1 A can then be routed to the input I of the inverter INVD1 B on the front side.

Similar to the output of the buffer BUFFD1 D, signals coming out of the output ZN of the inverter INVD1 B can be routed by the backside via 1203*b* and the super via 1201*b* to reach the BM1 layer (or perhaps directly to other back side layers such as BM2, BM3, etc.). A mirrored combination of the super via 1201*c* and the backside via 1203*c* can then route the signals to the input of a subsequent circuit.

In the present disclosure, novel architectures for routing electrical signals are provided. By using conductive tracks on the back side of the substrate, the substrate real-estate resources can be utilized more efficiently. By using long vias that can connect non-adjacent layers, signal routing can become more flexible. These benefits become all the more substantial as the fabrication process technology progresses and the transistors become smaller and smaller.

It will be understood that not all advantages have been necessarily discussed herein, no particular advantage is required for all embodiments or examples, and other embodiments or examples may offer different advantages.

According to an aspect of the present disclosure, an integrated circuit cell is provided. The integrated circuit cell may include a substrate, an active region, a first via, a first conductive layer, a second conductive layer, and a third conductive layer. The substrate may include a front side and a back side opposite the front side. At least a portion of the active region may be formed within the substrate. The first via is on the back side. The first conductive layer is on the back side. The second conductive layer is on the back side and may be located further away from the substrate in a first direction than the first conductive layer. The third conductive layer is on the back side and may be located further away from the substrate in the first direction than the second conductive layer. The depth of the first via along the first direction may be greater than a distance between the second conductive layer and the third conductive layer. The integrated circuit cell may include a cell height in a second direction substantially perpendicular to the first direction. A width of the first via along the second direction may be between about 0.05 to about 0.25 times the cell height.

In an embodiment, the first conductive layer may be electrically coupled to the first via. In an embodiment, the first conductive layer may be electrically coupled to a circuit element outside the integrated circuit cell.

In an embodiment, the active region may comprise a source/drain region of a transistor.

According to an aspect of the present disclosure, a semiconductor device is provided. The semiconductor device may include a substrate comprising a first side and a second side opposite the first side; a first plurality of layers on the first side; a second plurality of layers on the second side, a first via on the second side, and a second via on the second side. The second plurality may be fewer than the first plurality. The first via connects two adjacent layers of the second plurality of layers. The second via connects two layers of the second plurality of layers that are not adjacent to each other. The second via may be so adapted that electrical signals are routed on the second via.

According to an aspect of the present disclosure, a method is provided. The method may include: providing a substrate comprising a front side and a back side opposite the front side; forming an active region, wherein at least a portion of the active region is formed within the substrate; forming a first via on the back side; forming a first conductive layer on the back side; forming a second conductive layer on the back side and above the first conductive layer; forming a third conductive layer on the back side and above the second conductive layer; wherein a depth of the first via along a first direction is greater than a distance between the second conductive layer and the third conductive layer; wherein the integrated circuit cell comprises a cell height in a second direction substantially perpendicular to the first direction; wherein a width of the first via along the second direction is between about 0.05 to about 0.25 times the cell height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An integrated circuit cell, comprising:
    a substrate comprising a front side and a back side opposite the front side;
    an active region, at least a portion of the active region formed within the substrate;
    a first via on the back side;
    a first conductive layer on the back side;
    a second conductive layer on the back side and located further away from the substrate in a first direction than the first conductive layer;
    a third conductive layer on the back side and located further away from the substrate in the first direction than the second conductive layer;
    wherein a depth of the first via along the first direction is greater than a distance between the second conductive layer and the third conductive layer;
    wherein the integrated circuit cell comprises a cell height in a second direction substantially perpendicular to the first direction;
    wherein a width of the first via along the second direction is between about 0.05 to about 0.25 times the cell height.

2. The integrated circuit cell of claim 1, further comprising a second active region, wherein:
    the active region is a first active region elongated in a third direction substantially perpendicular to the first direction and the second direction;
    the second active region is elongated in the third direction; and
    a separation between the first active region and the second active region along the second direction is between about 0.2 to about 0.4 times the cell height.

3. The integrated circuit cell of claim 2, wherein the width of the first via along the second direction is between about 0.35 to about 0.5 times the separation between the first active region and the second active region along the second direction.

4. The integrated circuit cell of claim 1, further comprising at least two gate regions elongated in the second direction, wherein a pitch between the at least two gate regions is between about 35 to about 50 nanometers.

5. The integrated circuit cell of claim 1, wherein the cell height is between about 80 to about 300 nanometers.

6. The integrated circuit cell of claim 1, wherein the width of the first via along the second direction is between about 10 and about 25 nanometers.

7. The integrated circuit cell of claim 6, wherein a length of the first via along the third direction is between about 10 and about 25 nanometers.

8. The integrated circuit cell of claim 1, wherein the depth of the first via along the first direction is between about 30 and about 75 nanometers.

9. The integrated circuit cell of claim 1, further comprising a second via coupled between the active region and the second conductive layer.

10. The integrated circuit cell of claim 9, wherein the depth of the first via along the first direction is about 1.5 times a depth of the second via along the first direction.

11. The integrated circuit cell of claim 9, wherein an aspect ratio of the first via is about 150% of an aspect ratio of the second via.

12. The integrated circuit cell of claim 1, wherein the first conductive layer is electrically coupled to the second via.

13. The integrated circuit cell of claim 1, wherein the first conductive layer is separated from the second conductive layer in the first direction by about one third of the depth of the first via along the first direction.

14. The integrated circuit cell of claim 1, wherein the first via is electrically coupled to the third conductive layer.

15. The integrated circuit cell of claim 1, wherein electrical signals are conducted in the first via.

16. The integrated circuit cell of claim 15, wherein electrical signals are conducted to a circuit element outside the integrated circuit cell by way of the first via.

17. The integrated circuit cell of claim 16, wherein electrical signals are conducted to a different circuit cell by way of the first via and the third conductive layer.

18. The integrated circuit cell of claim 1, wherein a two-dimensional shape of the first via along the first direction is more funnel-like than that of the second via.

19. A semiconductor device, comprising:
    a substrate comprising a first side and a second side opposite the first side;
    a first plurality of layers on the first side;
    a second plurality of layers on the second side, wherein the second plurality is fewer than the first plurality;
    a first via on the second side, wherein the first via connects two adjacent layers of the second plurality of layers;
    a second via on the second side, wherein the second via connects two layers of the second plurality of layers that are not adjacent to each other;
    wherein the second via is so adapted that electrical signals are routed on the second via.

20. A method, comprising:
    providing a substrate comprising a front side and a back side opposite the front side;
    forming an active region, wherein at least a portion of the active region is formed within the substrate;
    forming a first via on the back side;
    forming a first conductive layer on the back side;
    forming a second conductive layer on the back side and above the first conductive layer;
    forming a third conductive layer on the back side and above the second conductive layer;
    wherein a depth of the first via along a first direction is greater than a distance between the second conductive layer and the third conductive layer;
    wherein the integrated circuit cell comprises a cell height in a second direction substantially perpendicular to the first direction;
    wherein a width of the first via along the second direction is between about 0.05 to about 0.25 times the cell height.

* * * * *